(12) United States Patent
Zeabari

(10) Patent No.: US 10,047,548 B2
(45) Date of Patent: Aug. 14, 2018

(54) LATCH ASSEMBLY FOR LATCH OPERATION OF CLOSURE PANELS FOR VEHICLES

(71) Applicant: Magna Closures Inc., Newmarket (CA)

(72) Inventor: John G. Zeabari, Highland, MI (US)

(73) Assignee: MAGNA CLOSURES INC., Newmarket (CA)

( * ) Notice: Subject to any disclaimer, the term of this patent is extended or adjusted under 35 U.S.C. 154(b) by 57 days.

(21) Appl. No.: 14/736,512

(22) Filed: Jun. 11, 2015

(65) Prior Publication Data

US 2015/0361694 A1   Dec. 17, 2015

Related U.S. Application Data

(60) Provisional application No. 62/013,113, filed on Jun. 17, 2014.

(51) Int. Cl.
| | |
|---|---|
| *H05K 7/00* | (2006.01) |
| *E05B 85/02* | (2014.01) |
| *E05B 81/54* | (2014.01) |
| *H05K 9/00* | (2006.01) |
| *E05B 81/06* | (2014.01) |
| *E05B 81/64* | (2014.01) |

(52) U.S. Cl.
CPC .............. *E05B 85/02* (2013.01); *E05B 81/54* (2013.01); *E05B 81/06* (2013.01); *E05B 81/64* (2013.01); *H05K 7/00* (2013.01); *H05K 9/00* (2013.01)

(58) Field of Classification Search
None
See application file for complete search history.

(56) References Cited

U.S. PATENT DOCUMENTS

| | | | | |
|---|---|---|---|---|
| 5,877,944 A | * | 3/1999 | Onizuka | H01H 85/20 361/644 |
| 6,191,941 B1 | * | 2/2001 | Ito | G06F 1/1616 312/223.1 |
| 6,430,054 B1 | * | 8/2002 | Iwata | H05K 7/026 174/560 |

(Continued)

FOREIGN PATENT DOCUMENTS

| | | |
|---|---|---|
| WO | WO2004103044 A1 | 11/2004 |
| WO | WO2010136004 A1 | 12/2010 |

*Primary Examiner* — Courtney Smith
*Assistant Examiner* — Rashen E Morrison
(74) *Attorney, Agent, or Firm* — Dickinson Wright PLLC

(57) ABSTRACT

A latch assembly is provided and has a latch housing containing latch components and is integrally coupled to an electronic control assembly having control electronics for controlling the latch components and sensors and switches external to the latch housing. The control housing includes an exterior wall defining an interior cavity for mounting the control electronics. The control housing provides a mechanical connector with an external connector including a set of double sided connectors for coupling an electrical connector to the control electronics. The double sided connectors have a first portion projecting away from the exterior wall and outside of the interior cavity and associated with the mechanical connector for connecting with an electrical system of the vehicle and a second portion projecting away from the exterior wall and into the interior cavity to connect to the control electronics.

26 Claims, 7 Drawing Sheets

(56) References Cited

U.S. PATENT DOCUMENTS

| | | | | |
|---|---|---|---|---|
| 6,724,627 B2* | 4/2004 | Onizuka | B60R 16/0238 | 165/185 |
| 6,740,834 B2* | 5/2004 | Sueyoshi | B60R 25/246 | 200/293.1 |
| 7,938,460 B2* | 5/2011 | Ishiguro | E05B 81/76 | 200/302.1 |
| 8,199,514 B2* | 6/2012 | Ito | B60R 16/0239 | 361/748 |
| 8,576,047 B2* | 11/2013 | Peschl | E05B 81/76 | 180/271 |
| 8,801,245 B2* | 8/2014 | De Wind | B60Q 1/2619 | 362/511 |
| 2003/0107473 A1* | 6/2003 | Pang | B60R 25/246 | 340/5.72 |
| 2004/0227374 A1* | 11/2004 | Hirota | B60R 25/00 | 296/146.1 |
| 2005/0198819 A1* | 9/2005 | Hunkeler | H05K 3/284 | 29/841 |
| 2009/0277682 A1* | 11/2009 | Bungo | H05K 3/284 | 174/521 |
| 2009/0296356 A1* | 12/2009 | Ito | B60R 16/0239 | 361/752 |
| 2010/0125388 A1* | 5/2010 | Nagatomo | B60W 50/0098 | 701/36 |
| 2011/0203336 A1* | 8/2011 | Mette | E05B 47/0611 | 70/277 |
| 2013/0130674 A1* | 5/2013 | De Wind | B60Q 1/2619 | 455/420 |
| 2014/0216810 A1 | 8/2014 | Blumenthal | | |
| 2014/0347163 A1* | 11/2014 | Banter | B60R 25/01 | 340/5.72 |
| 2015/0062825 A1* | 3/2015 | Ossimitz | H01L 21/4882 | 361/719 |
| 2015/0070319 A1* | 3/2015 | Pryor | G06F 3/0425 | 345/175 |

* cited by examiner

LATCH ASSEMBLY FOR LATCH OPERATION OF CLOSURE PANELS FOR VEHICLES

CROSS-REFERENCE TO RELATED APPLICATIONS

This application claims the benefit of U.S. Provisional Application No. 62/013,113 filed Jun. 17, 2014. The entire disclosure of the above application is incorporated herein by reference.

FIELD

The present disclosure relates to latches of vehicle closure panels.

BACKGROUND

This section provides background information related to the present disclosure which is not necessarily prior art.

Advancement in today's technology is allowing more and more features to be added to current vehicles. With these advancements, electronic controls are added to allow these functions to provide a service to the end customer which, in turn, is driving up the weight and cost of wiring harnesses and driving the need to decentralize the controls to individual vehicle subsystems. As the number of vehicle electronic control modules increase in current vehicles, manufacturers need to find solutions to simplify wiring configurations and placements for the vehicle subsystems while still providing for protection of environmental contaminant sensitive control electronics positioned in the vehicle.

SUMMARY

This section provides a general summary of the present disclosure and is not intended to be interpreted as a comprehensive disclosure of its full scope or all of its features, aspects, and objectives.

Accordingly, it is an aspect of the present disclosure to provide a housing assembly for control electronics of a latch assembly of a vehicle including an exterior wall defining an interior cavity for mounting the control electronics. The exterior wall encloses the control electronics and inhibits contact between the control electronics and environmental contaminants. The control electronics are mounted in the interior cavity. A double sided connector is mounted in the exterior wall and has a first portion projecting away from the exterior wall and outside of the interior cavity and a second portion projecting away from the exterior wall and into the interior cavity. The first portion is associated with a mechanical connector for connecting with an electrical system of the vehicle external to the housing assembly and the second portion is electrically connected to the control electronics.

It is another aspect of the present disclosure that the housing assembly further includes a plurality of conductors passing through the exterior wall and connected to the control electronics. The conductors are for coupling one or more electrical latch components of the latch assembly positioned external to the interior cavity.

It is another aspect of the present disclosure that the conductors are embedded in the exterior wall and follow a tortuous path through the exterior wall between the control electronics and the one or more electrical latch components.

According to an optional aspect of the present disclosure, the housing assembly further comprises a latch housing for housing the one or more latch components. The latch housing is affixed to the exterior wall.

According to a further aspect of the present disclosure, the housing assembly further comprises a plurality of conductors passing through the exterior wall and connected to the control electronics. The conductors are for coupling one or more electrical components external to a latch housing of the latch assembly and positioned externally to the interior cavity.

It is another aspect of the present disclosure that the control electronics include a printed circuit board electrically connected to the second portion of the double sided connector.

It is another aspect of the present disclosure that the control electronics include a printed circuit board electrically connected to the second portion of the double sided connector and to the conductors.

It is another aspect of the present disclosure that the control electronics include a printed circuit board electrically connected to the second portion of the double sided connector and to the conductors.

These and other aspects and areas of applicability will become apparent from the description provided herein. The description and specific examples in this summary are intended for purpose of illustration only and are not intended to limit the scope of the present disclosure.

DRAWINGS

The drawings described herein are for illustrative purposes only of selected embodiments and not all implementations, and are not intended to limit the present disclosure to only that actually shown. With this in mind, various features and advantages of example embodiments of the present disclosure will become apparent from the following written description when considered in combination with the appended drawings, in which.

DETAILED DESCRIPTION

In the following description, details are set forth to provide an understanding of the present disclosure. In some instances, certain circuits, structures, and techniques have not been described or shown in detail in order not to obscure the disclosure.

Vehicle wiring systems are continually increasing in both cost and weight. Vertically integrating the electronics into or otherwise adjacent to the electronic and/or mechanical latch components of a vehicle closure panel can drive down the cost of the vehicle, reduce vehicle weight, and/or reduce complexity of wiring throughout the vehicle.

Latch assemblies are part of closure panel systems (e.g. window regulators and latching/closure systems and electronics). Integrating control electronics with the latch assembly can provide for functional integration, standardization and weight savings. Further, standardized integrated interfaces between latch components and control electronic interfaces can provide for efficient adaption in closure designs to suit customer—specific vehicle design, including supplying integrated closure systems to assembly lines pre-tested, ready-to fit and synchronized with the vehicle production. Further, in view of consolidation of all relevant components of the control electronics and associated controlled elements of the latch assembly (e.g. motors, sensors, switches, etc.) in a single carrier plate/location, benefits can be realized from faster installation and lead times while enjoying potential increases overall quality and operational reliability. As such, integrating the control electronics locally with the latch components can provide for a reduction in component weight as well as wiring cost savings required for powered release/operation of a vehicle latch.

Figure 1:
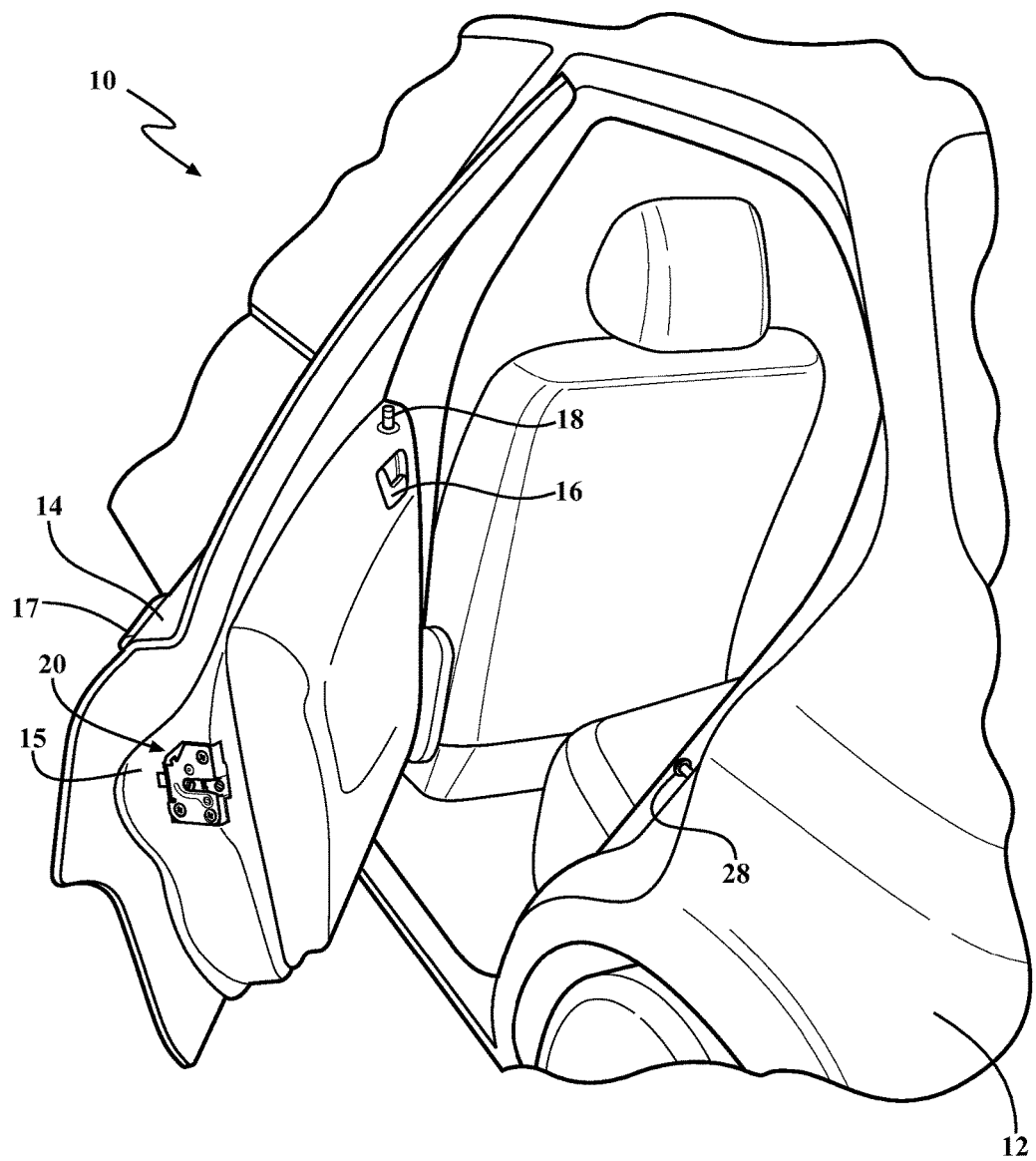
FIG. 1 is a perspective view of a closure panel system of a vehicle.

FIG. 1 is a perspective view of a vehicle 10 that includes a vehicle body 12 and at least one vehicle door 14 (also referred to as closure panel 14). The vehicle door 14 includes a latch assembly 20 that is positioned on an edge face 15 and which is releasably engageable with a striker 28 on the vehicle body 12 to releasably hold the vehicle door 14 in a closed position. An outside door handle 17 and an inside door handle 16 are provided for opening the latch assembly 20 (i.e. for releasing the latch assembly 20 from the striker 28) to open the vehicle door 14. An optional lock knob 18 is shown and provides a visual indication of the lock state of the latch assembly 20 and may be operable to change the lock state between an unlocked position and a locked position.

The closure panel 14 (e.g. occupant ingress or egress controlling panels such as but not limited to vehicle doors and lift gates/hatches) is connected to the vehicle body 12 via one or more hinges (not shown) and the latch assembly 20 (e.g. for retaining the closure panel 14 in a closed position once closed). It is also recognized that the hinge can be configured as a biased hinge that can be configured to bias the closure panel 14 towards the open position and/or towards the closed position. As shown in FIG. 1, the latch assembly 20 can be mounted on the closure panel 14 and the mating latch component 28 can be mounted on the body 12. Alternative to that shown in FIG. 1, the closure panel 14 can have a mating latch component 28 (e.g. striker) mounted thereon for coupling with a respective latch assembly 20 (e.g. with a ratchet component of the latch assembly 20) mounted on the vehicle body 12 (not shown).

Figure 2:
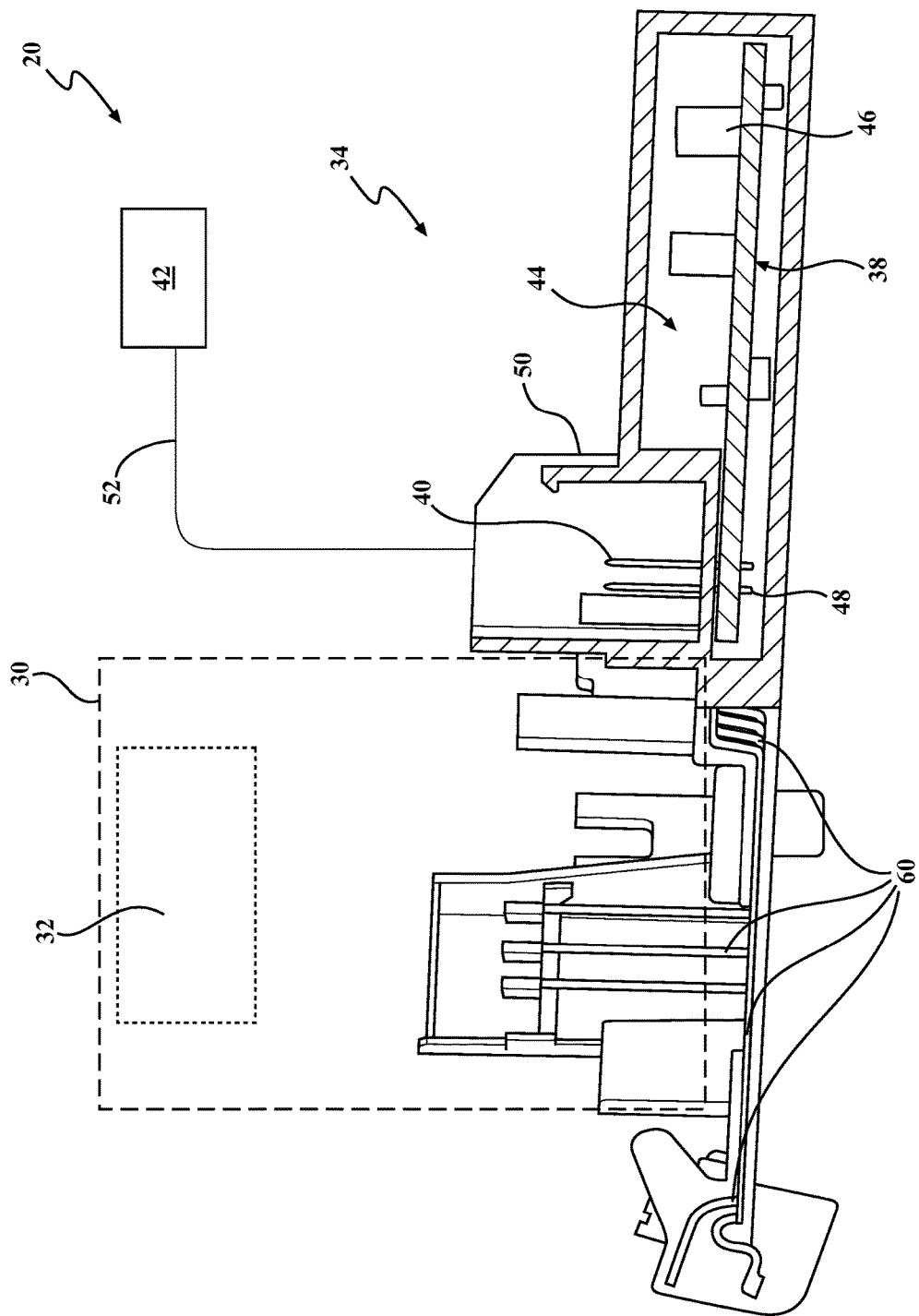
FIG. 2 is a cross sectional view of a latch assembly of the vehicle shown in FIG. 1.

Referring to FIG. 2, shown is the latch assembly 20 having a latch housing 30 containing latch components 32 (e.g. latch electronic motor 32a, electronic sensors/switches 32f, and mechanical components such as gears 32b, ratchet 32c, pawl 32d and other levers 32e, etc.—see FIG. 2) coupled to an electronic control assembly 34 for controlling the electronic components (e.g. motor 32a, sensors/switches 32f, etc.) of the latch components 32 as well as optionally any sensors/switches 36 (see FIG. 4) external to the latch housing 30, such as but not limited to door open/close position sensors (e.g. handle 16,17, knob 18, etc.), etc. The sensors/switches 32f, 36 can be contact or contactless sensors/switches, as desired. The electronic control assembly 34 can be considered as an electronic control unit (ECU) integrated with the latch housing 12 that controls electronically one or more of the electrical system or subsystems associated with the latch assembly 20 in the vehicle body 12.

For example, the electronic control assembly 34 can be programmed (via printed circuit board PCBA and associated control electronics 38—see FIG. 1) to implement latch operational control related functionality of a body control module (BCM) and can be coupled electronically to a power supply and/or other computer related functionality of other vehicle control systems (by external connector 40), provided by controllers such as but not limited to a central control module (CCM) or general electronic module (GEM) 42. Preferably the latch housing 30 is mounted or otherwise affixed on to a control housing 44 (or the control housing 44 is mounted or otherwise affixed on to the latch housing 30) in order to make the latch assembly 20, which is subsequently mounted to the closure panel 14 and/or vehicle body 12 (see FIG. 1). It is also recognized that the latch housing 30 can be spaced apart from the control housing 44 and thus the two housings 30,44 can be independently attached to the vehicle body 12 and/or closure panel 14 as independent components, as desired.

Figure 6:
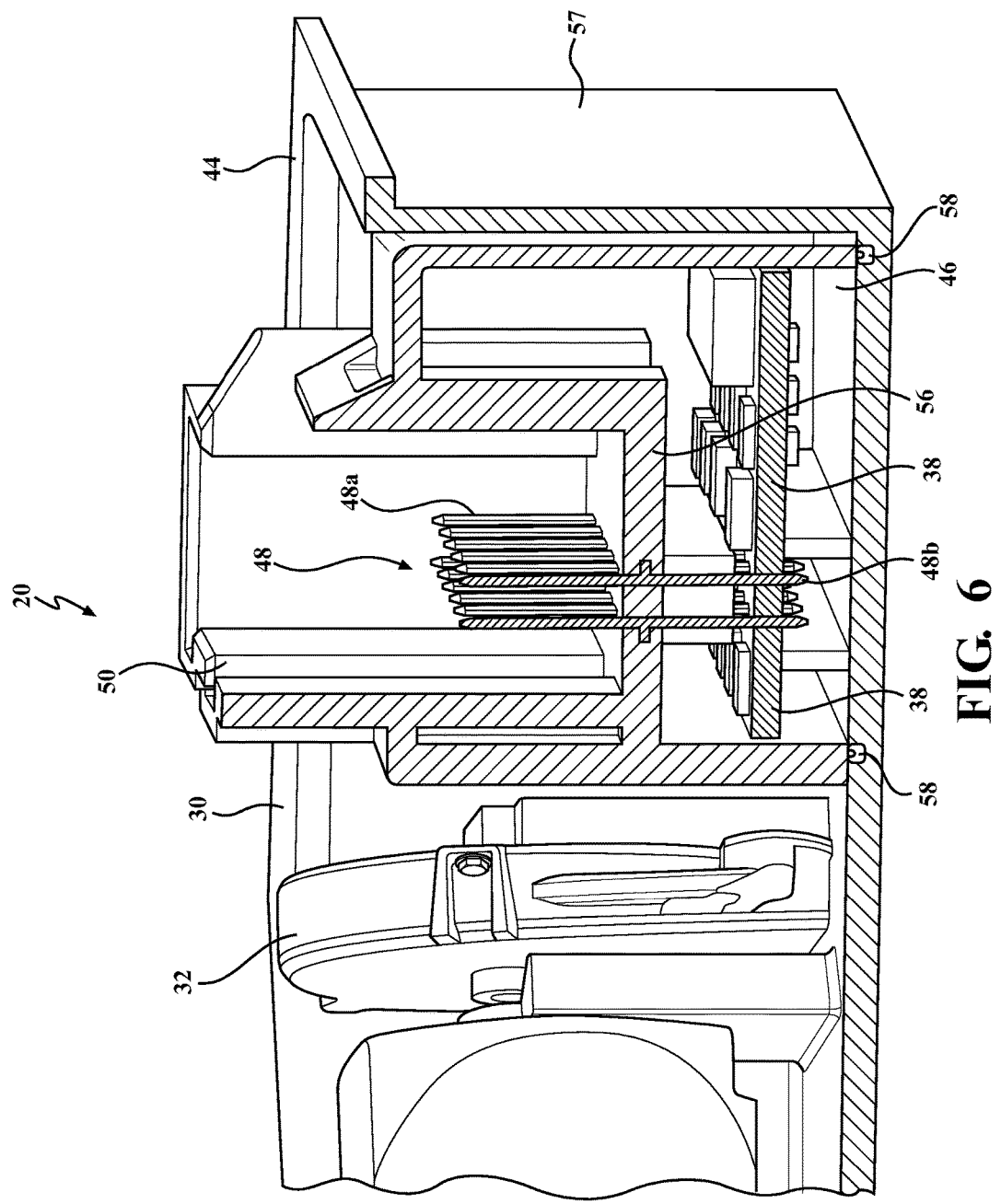
FIG. 6 is a cross sectional view of a portion of the latch assembly of FIG. 3.

Referring again to FIG. 2 and to FIG. 6, the latch assembly 20 has the latch housing 30 mechanically coupled to the control housing 44 (which can include the housings 30,44 cast/molded as an integral combined housing having sub-housings 30,44), which houses the control electronics 38 within an interior cavity 46 of the control housing 44. The control housing 44 also provides a mechanical connector 50 (e.g. connector plug, connector socket, etc.) for receiving the corresponding electrical connector 52 for electrically connecting the control electronics 38 to the other control modules 42 (e.g. supplying power to the latch assembly 20). The external connector 40 of the control housing 44 also includes a set of double sided connectors 48 (e.g. a plurality of pins) that are used to electronically couple the electrical connector 52 (external to the housing 44) to the control electronics 38 housed in the interior cavity 46 of the housing 44. The double sided connectors 48 have a connector portion 48a (see FIG. 6) associated with the mechanical connector 50, are situated external to the interior cavity 46 of the housing 44 and are configured to electronically connect with the electrical connector 52. The double sided connectors 48 also have a connector portion 48b passing though a divider or wall or partition 56 into the interior cavity 46 of the housing 44. The wall 56 can be part of the housing exterior 57 (one or more walls) separating the interior cavity 46 from the exterior (e.g. exterior environment). The connector portion 48b provides the electrical connection between the connector portion 48a and the electrical components (e.g. PCBA) of the control electronics 38. As such, the electrical components (e.g. PCBA) of the control electronics 38 are connected through the wall 56 of the housing 44 to the electrical connector 52 via the double sided connectors 48.

The double sided connectors 48 can also be referred to as a pin header (or simply header), as a form of electrical connector 48, often associated with cable connectors (e.g. ribbon cable connectors). The pin header can consists of one or more rows of pins spaced apart. Pin header connectors 48 are thus "male" connectors (female counterparts do exist, but these are normally just called "header" electrical connectors 48, without "pin") and can be used inside equipment, rather than being used as a connector positioned on the outside of a device.

The control electronics 38 can include the printed circuit board (PCB), which mechanically supports and electrically connects electronic components using conductive tracks, pads and other features etched from copper sheets laminated onto a non-conductive substrate. The PCB can be single sided (one copper layer), double sided (two copper layers) or multi-layer. The PCB populated with electronic components (i.e. the control electronics 38) used to implement the control/operational logic for the latch components 32 and various switches/sensors 36 is referred to as a printed circuit assembly (PCA), printed circuit board assembly or PCB assembly (PCBA), as desired.

Figure 3:
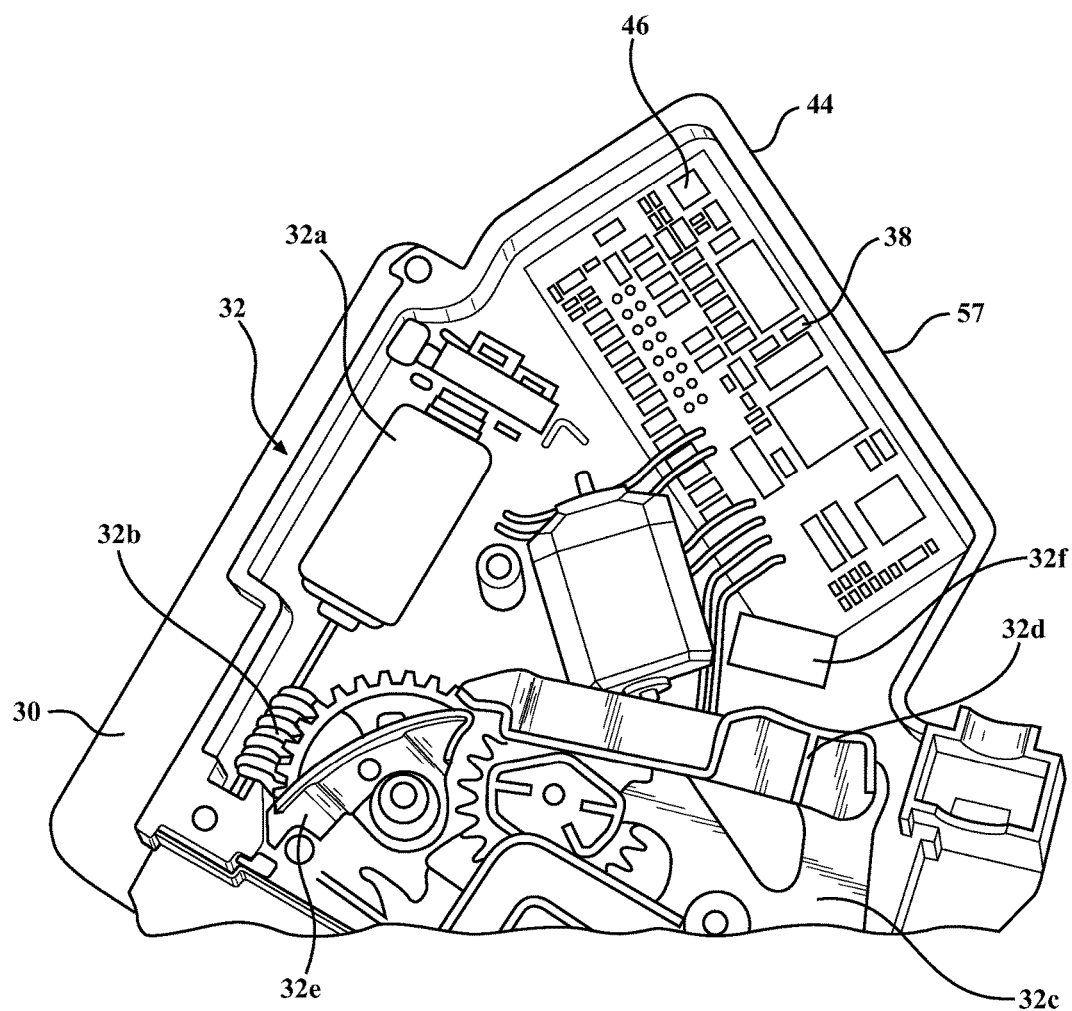
FIG. 3 is a bottom view of an embodiment of the latch assembly of FIG. 2.

Referring again to FIG. 6, the interior cavity 46 of the housing 44 can be sealed (e.g. using seals 58) via the exterior wall 57 to inhibit infiltration of foreign matter (e.g. moisture, dust, dirt, etc.) from penetrating from the exterior of the housing 44 into the interior cavity 46 that houses the control electronics 38, thus protecting the control electronics 38 from undesirable damage. As noted, the double sided connectors 48 can be molded or otherwise cast into the wall 56 (e.g. exterior wall) of the housing 44, thus providing for sealing and inhibition of penetration of foreign matter in to the interior cavity 46 via the mechanical connector 50. It is also noted in FIG. 3, that a separating wall between the interior cavity 46 (for control electronics 38) of the housing 44 and the latch components 32 in the housing 30 is not shown for clarity purposes only.

Figure 4:
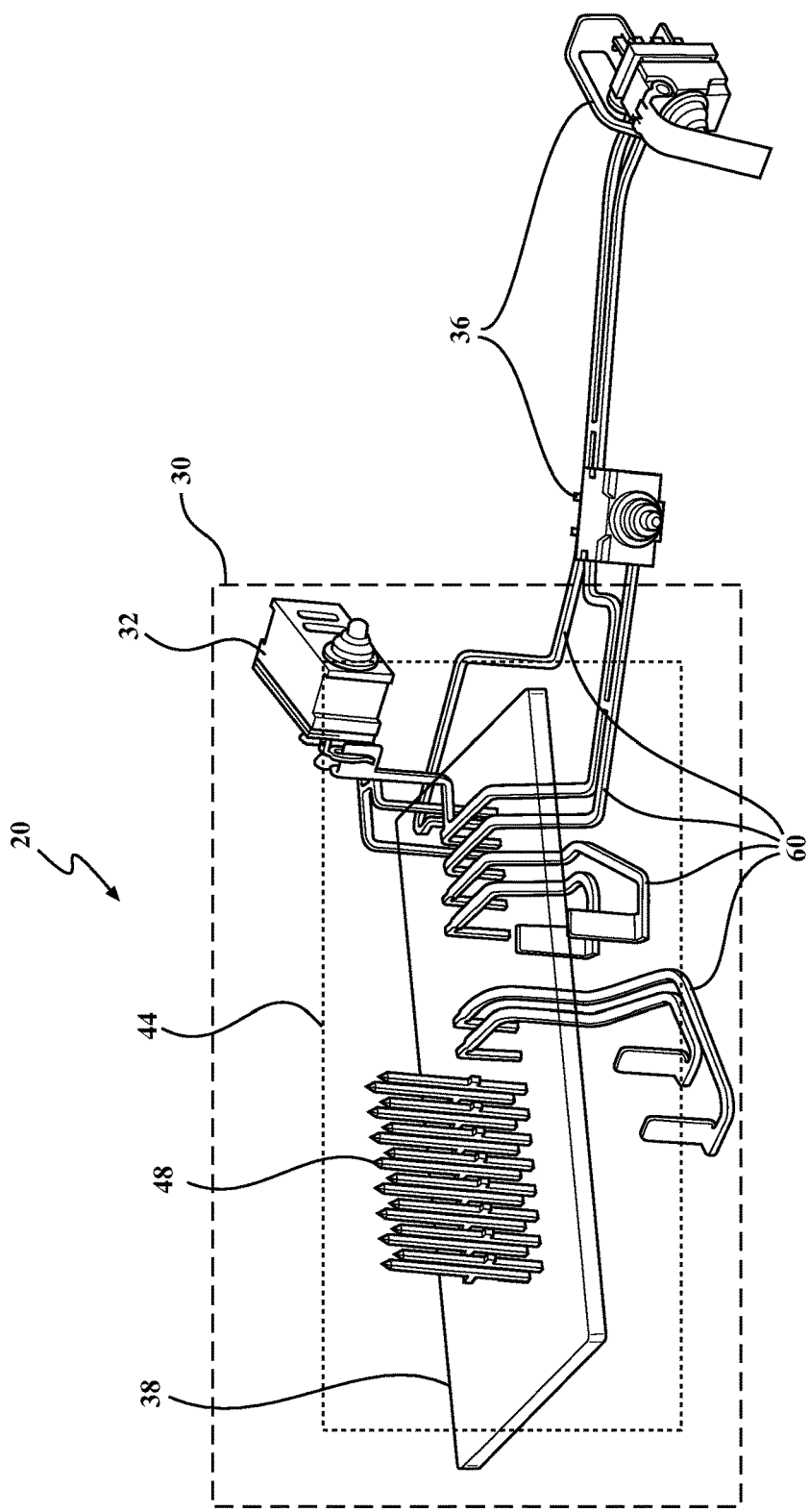
FIG. 4 is a plan view of the latch assembly shown in FIG. 2 with housings removed.

Referring to FIG. 4, shown is an example embodiment of the latch assembly 20 having the latch housing 30 and the control housing 44 shown in ghosted view for illustrative purposes. As such, conductors 60 are used to electrically connect the control electronics 38 with optional various vehicle sensors/switches 36 when present external to the latch assembly 20, as well as to electrical latch components 32 (e.g. sensors/switches, motors, etc.) situated within the latch housing 30. It is via these conductors 60 that the control electronics 38 can send and/or receive electrical signals with respect to the components 32,36 when implementing the control logic of the control electronics 38 with respect to operation (e.g. opening, closing, locking, unlocking, etc.) of the closure panel 14. The conductors 60 are connected directly to the control electronics 38 (e.g. directly to the PCB) and thus are used to transmit electrical (and/or considered optical signals in the case where the conductors 60 are optically conductive) signals with respect to the components 32,36 when implementing the control logic of the control electronics 38.

Figure 5:
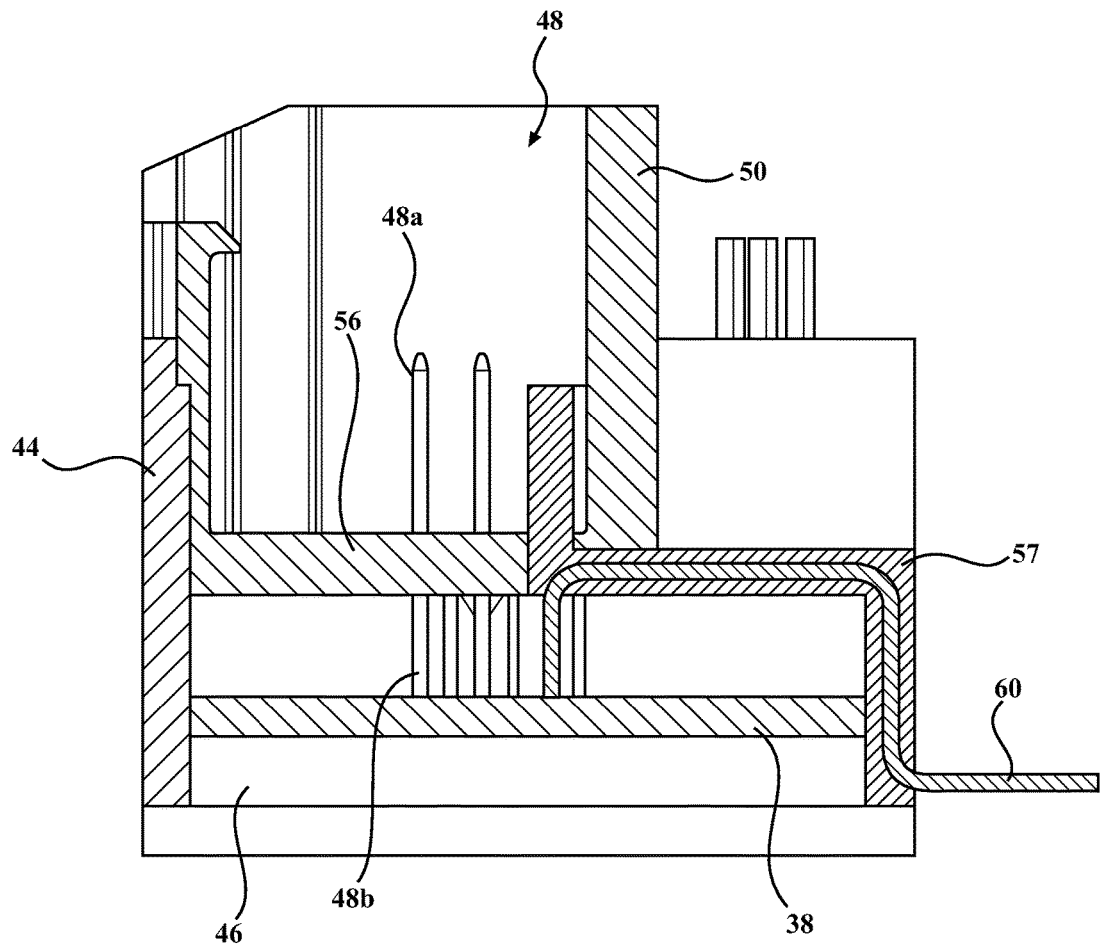
FIG. 5 is a further cross sectional view of a portion of the latch assembly of FIG. 1.

Referring to FIG. 5, shown is a cross sectional view of an embodiment of the latch housing 44 of the latch assembly 20. The conductors 60 are connected to the control electronics 38 and extend out of the interior cavity 46, via being embedded (e.g. cast) in the exterior wall 57 of the housing 44, and into the exterior (e.g. external to the interior cavity 46) for connection to any latch components 32 (see FIGS. 3,4) and/or optional external sensors/switches 36 (see FIG. 4) associated with the control logic of the control electronics 38. Alternatively, the conductors 60 can be attached to the control electronics 38 and be inserted through or otherwise molded in a passageway (similar to the double sided connectors 48) in the exterior wall 57 positioned between the control electronics 38 of the interior cavity 46 and the latch components 32 and/or optional external sensors/switches 36 of the exterior.

Further consideration is that the conductors 60 can be self supporting (e.g. can retain their physical path geometry (see FIG. 4) prior to being molded in the material of the exterior wall 57 of the housing 44 when the housing 44 is cast/formed (e.g. via injection molding). For example, the conductors 60 (for connection to components 32,36—e.g. to motor and switches) can be positioned and held in a mold (not shown), as well as the double sided connectors 48 (having portions 48a,48b in both directions in housing 44) for vehicle connection 52 and internal connection to the control electronics 38 of the interior cavity 46, and then the housing 44 can be cast/molded. The molding/casting of the double sided connectors 48 and/or the conductors 60 in the exterior wall 57 of the housing 44 can provide for an advantage of removing a connector on the ECU (e.g. module 40) and thus saving component cost and complexity, as well as situating the control electronics 38 closer to the latch components 32 and/or switches/sensors 36 without exposing the control electronics 38 to infiltration of foreign matter. Further, with the double sided connectors 48 (e.g. pins) in both direction, conductors 60 can be supported to reduce the amount of holes in the stamped conductors 60 and molding process.

As such, the conductors 60 can follow a tortuous (e.g. having or marked by repeated turns or bends; winding or twisting) path through the molded material of the exterior wall 57 of the housing 44 between the control electronics 38 and the components 32,36. In this manner, the conductors 60 can be connected to a number of components 32,36, such that the components 32,36 are mounted positionally on different planes/angles with respect to one another (for example see FIG. 4). As such, conductor 60 routing and locations in the latch assembly 20 provide for optimized double sided connectors 48 configuration (e.g. pin cluster) and a wave solder process for connecting double sided connectors 48 to the control electronics 38 (e.g. PCB traces) which can also maximize PCB space for other components.

Figure 7:
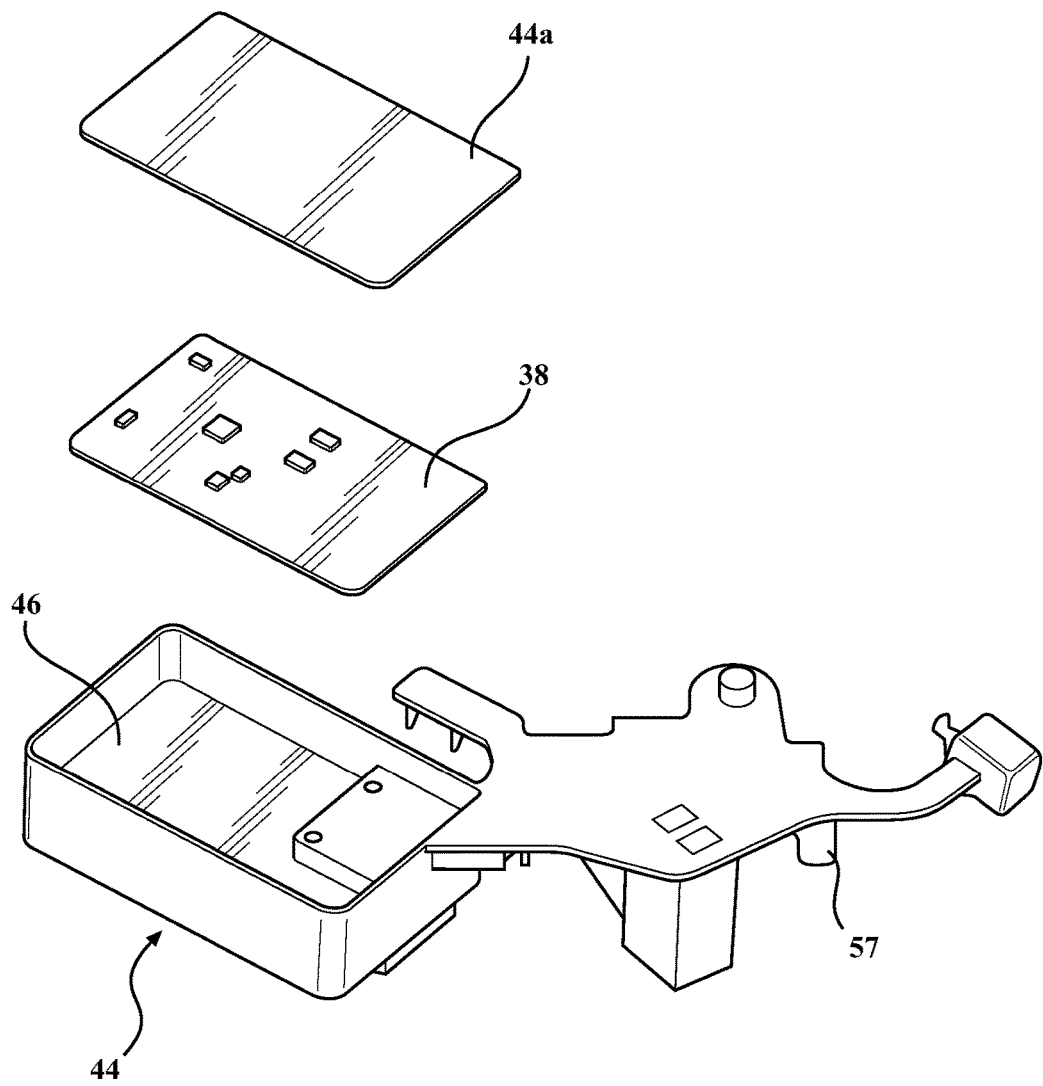
FIG. 7 is a plan view of an alternative embodiment of the latch assembly of FIG. 1.

Referring to FIG. 7, the control housing 44 is shown without the latch housing 30. As such, it is recognized that the conductors 60 (see FIG. 4) are embedded in the exterior wall 57 of the housing 44 and as such as not visible in FIG. 7 for illustrative purposes only. By example, the interior cavity 46 is formed by components 44a and 44b of the housing 44, suitable for containing and enclosing the control electronics 38. As such, it is recognized that the housing 44, the control electronics 38, the double sided connectors 48 (see FIG. 6) and optionally the conductors 60 (see FIG. 6) can be provided as a control housing assembly as a separate component to the latch housing 30 of the latch assembly 20 (see FIG. 2).

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Those skilled in the art will recognize that the inventive concept disclosed in association with an example latch assembly can likewise be implemented into many other vehicular systems. Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

What is claimed is:

1. A latch assembly for a vehicle comprising:
a latch housing containing at least one latch component;
a control housing connected to the latch housing and including an exterior wall defining an interior cavity containing control electronics, the exterior wall for enclosing the control electronics and inhibiting contact between the control electronics and environmental contaminants;
the control electronics mounted in the interior cavity;
a double sided connector mounted in the exterior wall having a first portion projecting away from the exterior wall and outside of the interior cavity and a second portion projecting away from the exterior wall and into the interior cavity, the first portion associated with a mechanical connector for connecting with an electrical system of the vehicle external to the housing assembly and the second portion electrically connected to the control electronics;
wherein the second portion of the double sided connector includes a plurality of pins being in series with one another and adjacent to one another.

2. The latch assembly of claim 1 further comprising a plurality of conductors passing through the exterior wall and connected to the control electronics, the conductors for coupling one or more electrical latch components of the latch assembly positioned external to the interior cavity.

3. The latch assembly of claim 1, wherein the control electronics are configured to be reprogrammed to implement latch operational control functionality.

4. The latch assembly of claim 1, wherein the double sided connector comprises a plurality of pin header connectors being male.

5. The latch assembly of claim 1, wherein the double sided connector comprises a plurality of header connectors being female.

6. A latch assembly for a vehicle comprising:
a latch housing containing at least one latch component;
a control housing connected to the latch housing and including an exterior wall defining an interior cavity containing control electronics, the exterior wall for enclosing the control electronics and inhibiting contact between the control electronics and environmental contaminants;
the control electronics mounted in the interior cavity; and
a double sided connector mounted in the exterior wall having a first portion projecting away from the exterior wall and outside of the interior cavity and a second portion projecting away from the exterior wall and into the interior cavity, the first portion associated with a mechanical connector for connecting with an electrical system of the vehicle external to the housing assembly and the second portion electrically connected to the control electronics;
wherein the exterior wall of the control housing includes a base portion and a sidewall portion, wherein the sidewall portion extends transversely to the base portion, and at least one seal is disposed between the base portion and the sidewall portion for inhibiting infiltration of foreign matter penetrating from the exterior of the housing assembly.

7. The latch assembly of claim 1, wherein the control electronics include a printed circuit board electrically connected to the second portion of the double sided connector.

8. The latch assembly of claim 2, wherein the conductors are embedded in the exterior wall and follow a tortuous path through the exterior wall between the control electronics and the one or more electrical latch components.

9. The latch assembly of claim 1, wherein the latch housing and the control housing are integrally connected to one another.

10. The latch assembly of claim 1 wherein the first portion of the double sided connector extends in a first direction and the second portion of the double sided connector extends in and terminates in a second direction opposite the first direction.

11. The latch assembly of claim 1 wherein the control electronics include a printed circuit board electrically connected to the second portion of the double sided connector, and wherein the double sided connector extends substantially linearly along its entire length between the first portion and the second portion at the printed circuit board.

12. The latch assembly of claim 1 further comprising a plurality of conductors passing through the exterior wall and connected to the control electronics, the conductors for coupling one or more electrical components external to a latch housing of the latch assembly and positioned externally to the interior cavity.

13. The latch assembly of claim 12, wherein the one or more electrical components are selected from the group consisting of: a sensor and a switch.

14. The latch assembly of claim 11, wherein the printed circuit board overlies and is positioned adjacent to the exterior wall, and wherein the double sided connector extends perpendicularly to the printed circuit board to the first portion and the second portion.

15. The latch assembly of claim 12, wherein the conductors are optically conductive.

16. The latch assembly of claim 12, wherein the exterior wall is molded and the conductors are self supporting for positioning and holding while the exterior wall is molded.

17. A latch assembly for a vehicle comprising:
a latch housing containing a plurality of latch components;
a control housing mechanically coupled with the latch housing and having an exterior wall defining an interior cavity containing control electronics, the exterior wall for enclosing the control electronics and inhibiting contact between the control electronics and environmental contaminants, the control electronics configured to control the latch components;
the control housing including a double sided connector mounted in the exterior wall having a first portion projecting away from the exterior wall and outside of the interior cavity and a second portion projecting away from the exterior wall and into the interior cavity, the first portion associated with a mechanical connector for connecting with an electrical system of the vehicle external to the housing assembly and the second portion electrically connected to the control electronics;
the first portion of the double sided connector extending in a first direction and the second portion of the double sided connector extending and terminating in a second direction opposite the first direction; and
a plurality of conductors embedded in and passing through the exterior wall and connected to the control electronics, the conductors for coupling one or more electrical components external to the latch housing of the latch assembly and positioned externally to the interior cavity;
wherein the second portion of the double sided connector includes a plurality of rows of pins disposed adjacent to one another to form a cluster of pins.

18. The latch assembly of claim 17, wherein the exterior wall is molded and the conductors are self supporting for positioning and holding while the exterior wall is molded.

19. The latch assembly of claim 17, wherein the double sided connector extends linearly along its entire length between the first portion and the second portion.

20. The latch assembly of claim 17, wherein the control electronics include a printed circuit board electrically connected to the second portion of the double sided connector and to the conductors, and wherein the printed circuit board extends perpendicularly to the double sided connector and is positioned adjacent to the exterior wall and overlies the exterior wall.

21. The latch assembly of claim 1 wherein the double sided connector extends linearly along its entire length between the first portion and the second portion.

22. The latch assembly of claim 1, wherein the first portion of the double sided connector includes a plurality of pins being in series with one another and adjacent to one another.

23. The latch assembly of claim 1, wherein the first portion of the double sided connector includes a plurality of rows of pins disposed adjacent to one another to form a cluster of pins.

24. The latch assembly of claim 17, wherein the second portion of the double sided connector includes a plurality of pins being in series with one another and adjacent to one another.

25. The latch assembly of claim 1, wherein the second portion of the double sided connector includes a plurality of rows of pins disposed adjacent to one another to form a cluster of pins.

26. The latch assembly of claim 12, wherein the control electronics include a printed circuit board electrically connected to the second portion of the double sided connector, and wherein at least one of the conductors exits the exterior wall beneath the printed circuit board in a direction opposite the double sided connector.

\* \* \* \* \*